(12) United States Patent
Findlay et al.

(10) Patent No.: US 8,876,304 B2
(45) Date of Patent: Nov. 4, 2014

(54) IMAGING ASSEMBLY

(75) Inventors: Ewan Findlay, Dollar (GB); Colin McGarry, Broxburn (GB)

(73) Assignee: STMicroelectronics (Research & Development) Limited, Marlow Bucks (GB)

( * ) Notice: Subject to any disclaimer, the term of this patent is extended or adjusted under 35 U.S.C. 154(b) by 1321 days.

(21) Appl. No.: 12/624,876

(22) Filed: Nov. 24, 2009

(65) Prior Publication Data

US 2010/0128350 A1 May 27, 2010

(30) Foreign Application Priority Data

Nov. 25, 2008 (GB) .................................. 0821504.8

(51) Int. Cl.
*G02B 1/11* (2006.01)
*H01L 31/0232* (2014.01)
*H01L 27/146* (2006.01)
*H01L 31/0216* (2014.01)

(52) U.S. Cl.
CPC ............ *G02B 1/118* (2013.01); *H01L 27/14632* (2013.01); *H01L 2924/16788* (2013.01); *H01L 2924/16235* (2013.01); *H01L 31/02161* (2013.01); *H01L 27/14643* (2013.01); *H01L 31/0232* (2013.01); *H01L 27/14618* (2013.01); *H01L 27/14685* (2013.01)
USPC .......................................... 359/614; 359/738

(58) Field of Classification Search
CPC ............ G02B 1/12; G02B 1/118; G02B 3/00; G02B 3/08; G02B 3/0006; G02B 3/0031; G02B 3/0075; G02B 5/001; G02B 5/005; G02B 5/02; G02B 5/1809; G02B 7/022; G02B 7/10; G02B 7/20; G02B 9/04; G02B 9/12; G02B 9/34; G02B 13/0035; G02B 13/0055; G02B 13/001–13/008; G02B 13/22; G02B 21/00; G02B 23/243; G02B 23/2461; G02B 27/0037; G02B 27/0043; G02B 27/006; G02B 27/4211; G02B 27/4222; G02B 2207/121; H04N 5/2254; H04N 5/2257; H04N 5/3572; H04N 9/3114
USPC .......... 359/601, 613, 614, 738–740, 580–582
See application file for complete search history.

(56) References Cited

U.S. PATENT DOCUMENTS 4,396,643 A * 8/1983 Kuehn et al. .................. 427/160
5,444,520 A 8/1995 Murano
(Continued)

FOREIGN PATENT DOCUMENTS

EP 1008453 6/2000
EP 1560271 8/2005
(Continued)

*Primary Examiner* — Stephone B Allen
*Assistant Examiner* — Jeffrey Madonna
(74) *Attorney, Agent, or Firm* — Allen, Dyer, Doppelt, Milbrath & Gilchrist, P.A.

(57) ABSTRACT

An image assembly may include a substrate having a face, a first optical layer and at least one spacer member. The imaging assembly may also include an anti-reflection structure. The at least one spacer member may be arranged between the substrate and the first optical layer to define an air gap therebetween. The anti-reflection structure may be coupled to at least part of the face and at least one of the first optical layer and the at least one spacer member. The anti-reflection structure may also include a plurality of projections having dimensions smaller than a wavelength of radiation to be imaged by the imaging assembly.

32 Claims, 5 Drawing Sheets

(56) References Cited

U.S. PATENT DOCUMENTS

| | | | | |
|---|---|---|---|---|
| 5,962,842 A * | 10/1999 | Kimura | ................... | 250/208.1 |
| 6,072,634 A * | 6/2000 | Broome et al. | ............... | 359/637 |
| 6,606,195 B2 * | 8/2003 | Tsuji | ........................ | 359/566 |
| 7,158,318 B2 * | 1/2007 | Shirie | ......................... | 359/738 |
| 7,528,884 B2 * | 5/2009 | Minamio et al. | ............. | 348/373 |
| 7,530,699 B2 * | 5/2009 | Shulepova et al. | ........... | 359/614 |
| 8,279,336 B2 * | 10/2012 | Tsuduki et al. | ............... | 348/374 |
| 2002/0000244 A1 | 1/2002 | Zaidi et al. | | |
| 2005/0093210 A1 * | 5/2005 | Umetani et al. | ............... | 264/528 |
| 2005/0094277 A1 | 5/2005 | Khusnatdinov et al. | ...... | 359/601 |
| 2005/0226608 A1 | 10/2005 | Kwon et al. | | |
| 2006/0023108 A1 * | 2/2006 | Watanabe et al. | ............. | 348/335 |
| 2006/0044450 A1 * | 3/2006 | Wolterink et al. | ............ | 348/340 |
| 2006/0187608 A1 * | 8/2006 | Stark | ........................... | 361/202 |
| 2006/0227834 A1 * | 10/2006 | Yoshikawa et al. | ........ | 372/50.11 |
| 2007/0109439 A1 * | 5/2007 | Minamio et al. | ............. | 348/340 |
| 2007/0144700 A1 * | 6/2007 | Kobayashi et al. | ............. | 164/14 |
| 2007/0195417 A1 * | 8/2007 | Yamamoto et al. | ........... | 359/590 |
| 2007/0247718 A1 * | 10/2007 | Yoshikawa et al. | ........... | 359/614 |
| 2007/0291386 A1 * | 12/2007 | Yoshikawa et al. | ........... | 359/885 |
| 2008/0118241 A1 * | 5/2008 | TeKolste et al. | .............. | 396/439 |
| 2009/0120566 A1 * | 5/2009 | Okayama et al. | ............. | 156/230 |
| 2009/0121304 A1 * | 5/2009 | Terada | .......................... | 257/434 |
| 2009/0257127 A1 * | 10/2009 | Okayama et al. | ............. | 359/601 |
| 2010/0246020 A1 * | 9/2010 | Wolterink et al. | ............ | 359/622 |
| 2011/0051251 A1 * | 3/2011 | Endoh et al. | ................... | 359/614 |
| 2011/0204531 A1 * | 8/2011 | Hara et al. | ................... | 264/1.36 |

FOREIGN PATENT DOCUMENTS

| | | |
|---|---|---|
| EP | 2094000 | 8/2009 |
| WO | 2004/027880 | 4/2004 |
| WO | WO 2007007755 A1 * | 1/2007 |

* cited by examiner

IMAGING ASSEMBLY

FIELD OF THE INVENTION

The present invention relates to an imaging assembly and particularly, but not exclusively, to an imaging assembly for use with solid state or wafer scale image sensors and a method of manufacturing the imaging assembly.

BACKGROUND OF THE INVENTION

Solid state or wafer scale image sensors are incorporated into low cost cameras and other devices, such as mobile cellular telephones and personal digital assistants, optical devices and medical imaging devices. It is known to provide wafer scale miniature cameras incorporating lenses produced using over-molding techniques on glass substrates, which can survive the high temperature solder reflow processes used in the manufacture of such devices. Such lenses are usually stacked together, separated by spacer members to provide an air gap between each lens.

Currently non-light transmissive surfaces of such lens arrangements, for example, the inner faces of the spacer members, are coated with an anti-reflection coating, such as a black material. While such coating reduces reflections, it does not eliminate them. Thus, these surfaces define a low reflectivity specular reflector in the system. A typical reflectance of such coated surfaces may be 4% or more, which will produce undesirable ghost images and other stray light effects in the image plane of such an imaging assembly.

Furthermore, the surfaces of the glass wafer used as substrates for the lenses may reflect light outside the lens aperture. The intensity of the reflected light will be around 4% of the incident intensity, increasing with angle of incidence, and may not be dissipated by diffuse reflections.

Currently air-cavity chip scale packages (AC-CSP) have been developed for encapsulating CMOS image sensors. A typical chip scale package includes a silicon wafer onto which the complementary metal oxide semiconductor (CMOS) sensor is built by standard semiconductor processes, a spacer member comprising a wall structure mounted onto the wafer to hold a fixed "air-cavity" between the sensor surface, and a glass package lid mounted on the spacer member. The electrical contacts to the CMOS sensor are typically made by routing, from custom connection pads on front of the silicon wafer, to pads.

It may be necessary to expansion match all parts of the assembly. The glass material of the spacer member and the package lid is near expansion matched to the silicon of the wafer. Therefore it may not be possible to apply anti-reflection coatings to the components of the assembly, partly due to the stresses that reliable high quality (low surface defect occurrence) thin-film dielectric interference coatings place on the glass wafer. These stresses result in deviations in flatness and warping of the glass which affects either the process of bonding the glass spacer member and package lid to the silicon wafer, or the stresses generated in the silicon as it holds the glass in tension. This later problem results in the silicon wafer cracking as it is back-lapped (ground down to a thickness) while attached to the package lid prior to the application of the rear layer of the assembly and singulation of the glass/silicon structure to form a final chip scale package. Therefore, there is a need to reduce unwanted internal reflections within such imaging assemblies without expensive and often unsuitable anti-reflection coatings.

SUMMARY OF THE INVENTION

According to a first aspect, an imaging assembly is provided that includes a substrate, a first substantially transparent optical layer, and at least one spacer member. The at least one spacer member may be arranged between the substrate and the first optical layer to define an air gap between the substrate and the first optical layer. An anti-reflection structure may be provided on substantially all non-light transmissive regions of the imaging assembly exposed to the air gap to reduce internal reflections within the imaging assembly. The anti-reflection structure may include a plurality of projections having dimensions smaller than the wavelength of the radiation to be imaged by the imaging assembly to reduce unwanted reflections. The anti-reflection structure may include a plurality of projections having a height less than the wavelength of visible light, typically between 200 and 800 nm.

In one embodiment, the first optical layer has the anti-reflection formed across the whole of one surface, and also has a light-transmissive optical element positioned on top of and in intimate contact with the anti-reflection surface. The anti-reflective structure and the optical element may have refractive indices sufficiently similar to cause the junction between them to be substantially invisible at wavelengths of interest. At least a portion of the anti-reflection structure may be coated with an optically absorbent material, such as a carbon loaded epoxy resin.

In some embodiments, the imaging assembly may further include a solid state image sensor provided or mounted on the substrate. The imaging assembly may include a wafer scale lens. The first optical layer may include an at least partially transparent member having an upper surface and a lower surface. A lens may be provided on at least one of the upper and lower surfaces. The inner faces of the spacer member may face the air gap may be provided with the anti-reflection structure.

The imaging assembly may include a further spacer member mounted on the upper surface of the optical layer. A further optical layer may be mounted on the further spacer member to be spaced above the first optical layer. The further optical layer may have an upper surface and a lower surface. A lens may be provided on at least one of the upper and lower surfaces thereof. The inner faces of the further spacer member may face the gap between the first and further optical layers being provided with the anti-reflection structure.

A plurality of further spacer members and a plurality of further optical layers arranged in a coaxial stacked relationship upon the first optical layer may be provided. Each further spacer member may be provided with the anti-reflection structure on the inner faces thereof.

The imaging assembly may include a CMOS image sensor. The substrate may include a silicon wafer having an image sensor formed thereon. The spacer member may include a wall structure attached to the substrate to encompass the image sensor. The first optical layer may include a cover attached to the spacer member to define a closed cavity over the image sensor. The inner faces of the spacer member and the first optical layer exposed to the air gap may be provided with the anti-reflection structure.

The substrate and/or the optical layer may be provided with surface features to aid alignment of the spacer member upon the substrate and/or the optical layer to improve adhesion of the spacer member thereto. The surface features may include a roughened surface region to improve adhesion of the spacer means to the substrate and/or the optical layer. Alternatively, the surface features may include raised formations to aid location of the spacer member on the substrate and to reduce stresses at the junction of the spacer member and the substrate and/or the optical layer.

According to another aspect, a method of manufacturing an imaging assembly which includes a substrate, a substantially transparent optical layer, and at least one spacer member is provided. The at least one spacer member is arranged between the substrate and the optical layer to define an air gap between the substrate and the optical layer. The method may include forming an anti-reflection structure on substantially all non-light transmissive regions of the imaging assembly exposed to the air gap to reduce internal reflections within the imaging assembly. The anti-reflection structure may include a plurality of projections having dimensions smaller than the wavelength of the radiation to be imaged by the imaging assembly.

The anti-reflection structure may be formed by one or more of direct lithographic etching, laser ablation techniques, transfer molding, embossing processes, or fine sand blasting or grinding of the surfaces with a fine grit. The anti-reflection structure may be formed in the same step as forming a lens on one or both of the supper and lower surfaces of the optical layer.

In an embodiment, the anti-reflection structure may be formed over substantially all of one or both of the upper and lower surfaces and over-molding one or more optical components on at least a portion of the anti-reflection structure on one or both of an upper and a lower surface of the optical layer.

The method may include providing an image sensor on or mounted on the substrate. The method may include forming the anti-reflection structure on a region of the substrate around the image sensor. The method may further include coating at least a portion of the anti-reflection structure with an optically absorbent material, such as a carbon loaded epoxy resin.

The imaging assembly may be incorporated in a mobile device such as a mobile cellular telephone or a cameras, in a medical device, such as an endoscope, or in an optical pointing device.

BRIEF DESCRIPTION OF THE DRAWINGS

An embodiment will now be described with reference to the accompanying drawings, in which:

FIG. 2b is a side view of the moth eye structure of FIG. 2a.

DETAILED DESCRIPTION OF THE PREFERRED EMBODIMENTS

Figure 1:
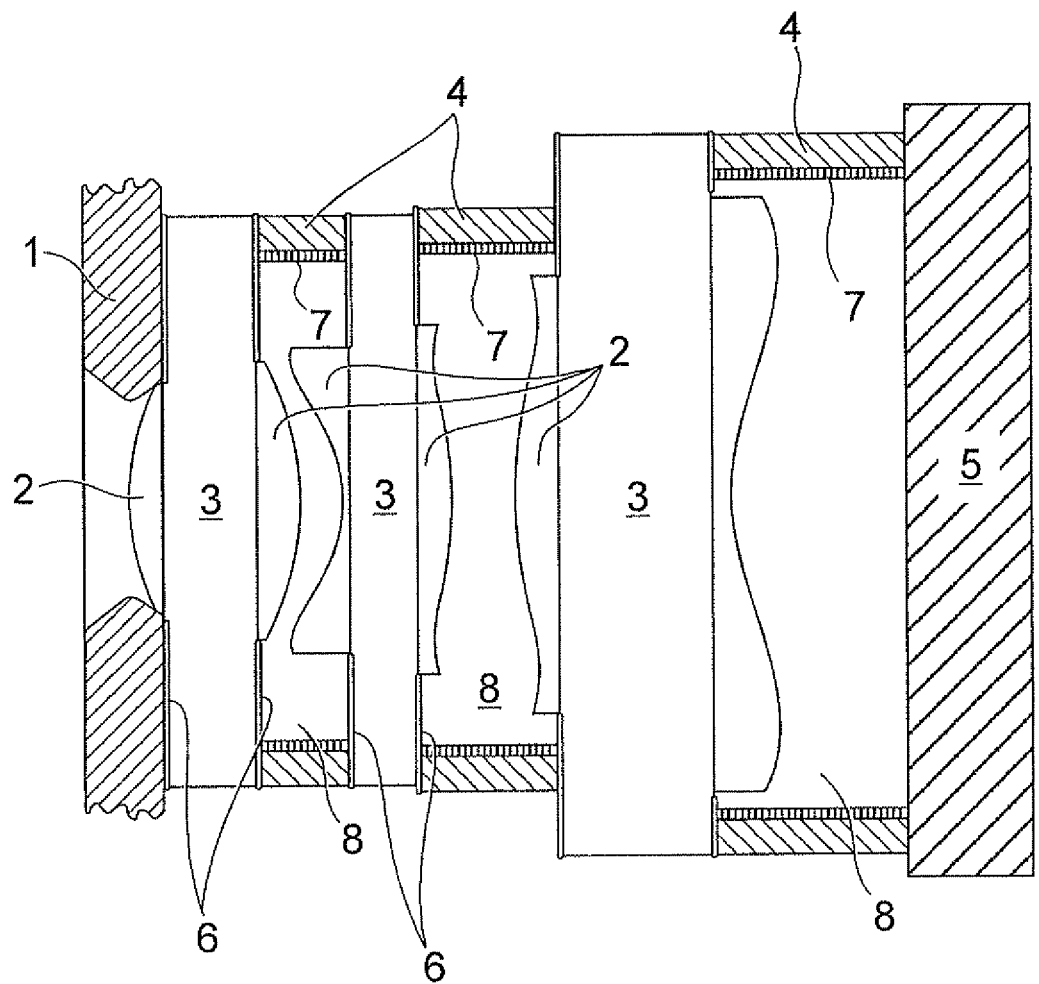
FIG. 1 illustrates an imaging assembly according to a first embodiment of the present invention.

As illustrated in FIG. 1, a wafer scale lens may include a stacked arrangement of components, including, from the outermost component to the innermost, a cover 1, which provides baffling from the outside world and extends around the outermost lens element 2 to prevent light entering other than by the aperture stop, and a plurality of lens elements 2 implemented by over-molded features on substrate glass wafers 3. The lens elements 2 are separated by spacer members 4 which hold the lens elements 2 at a fixed separation from each and from an image sensor provided on a substrate 5. Air gaps 8 are therefore formed between the substrate wafers 3 and lenses 2, and within the spacer members 4.

FIG. 1 illustrates a large number of flat glass surfaces present around the lens elements 2 and also between the lens elements 2. These flat surfaces may leak and/or reflect stray-light back into the camera system, and as such, may normally require an angle of incidence insensitive absorption coating.

In accordance with an embodiment, such flat surfaces are provided with a moth eye structure 7. The moth eye structure 7 may be on those parts of the substrate 3 which surround the lens elements 2, and a moth eye structure may be on the interior surfaces of the spacer members 4. Such moth eye structures may include a nanoscale relief structure including projections having a height in order of 200 to 600 nm, i.e. smaller than the wavelength of visible light. Such structures, resembling that of a moth's eye, are known to suppress surface reflections.

Figure 2A:
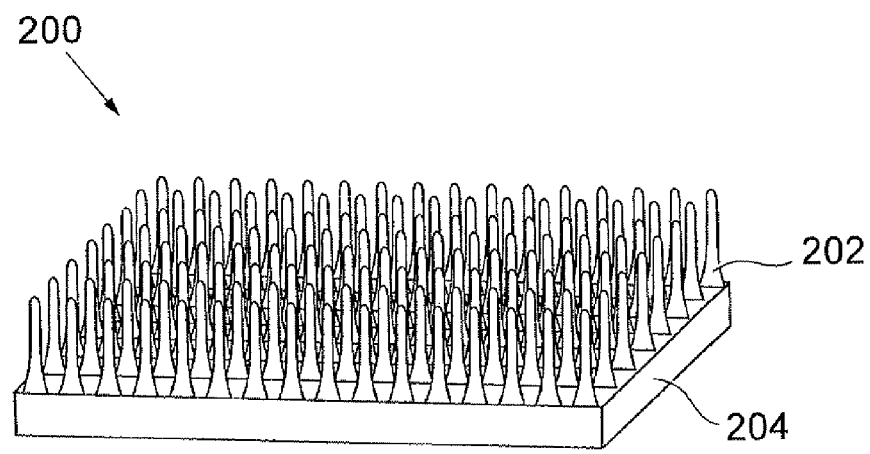
FIG. 2a is a perspective view of one form of moth eye structure included in the imaging assembly of FIG. 1.
Figure 2B:
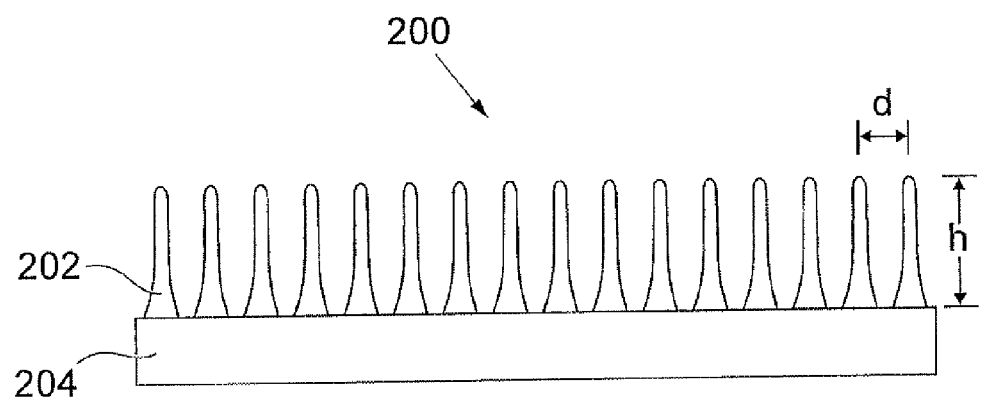

FIGS. 2a and 2b illustrate one form of moth eye structure 200 including generally conical formations 202 extending from a substrate 204. Other forms of projections are possible, for example, pyramidal. The formations may be of varying heights within the structure, provided the height h is smaller than the light wavelength of interest. Also, the formations may be in a regular matrix, as show, or irregularly disposed.

The moth eye structure may be made in a lithographic etch or deposition process which is transferred to the refracting medium either directly or by over-molding. Thus, a large scale process for imposing the moth eye structure on the glass substrate wafer may be performed. The fact that the material used in the moth eye structure has the same, or nearly the same, refractive properties as the other over-molded optical components allows it to "disappear" where the optical refracting components are superimposed, either through over-molding or by gluing. In some systems the moth eye structure may be printed along with the optical components on the substrate glass wafer.

Figure 3:
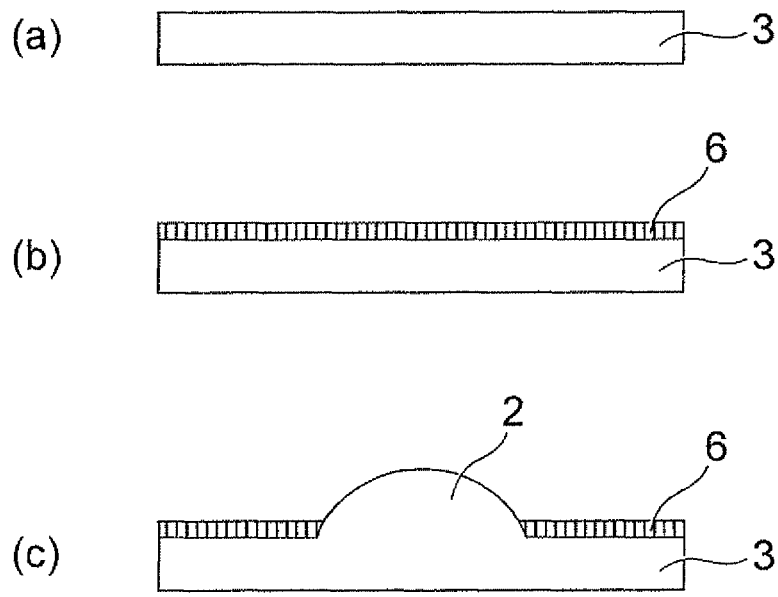
FIGS. 3a-c illustrate steps for implementing an embodiment of the present invention.
Figure 4:
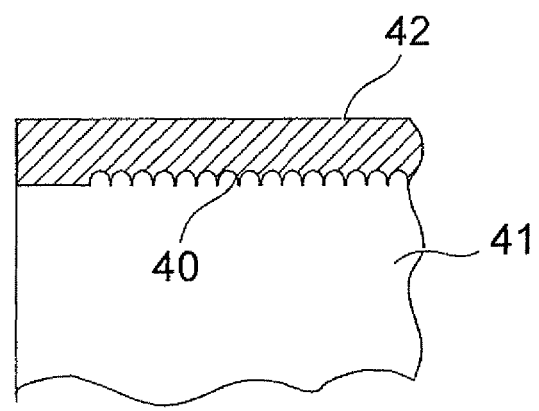
FIG. 4 illustrates a moth eye structure combined with an absorber in accordance with the present invention.

FIGS. 3a-c illustrate one form of the "disappearing" feature. A glass substrate 3 (FIG. 3a) has a moth eye structure formed over its entire surface (FIG. 3b). A lens 2 is then molded on top of the moth eye structure (FIG. 3c). Since the refractive indices of the elements 2, 3, 6 are the same or substantially the same, the moth eye structure in the area of the lens 2 effectively disappears.

Where the moth eye structure is exposed, it may be coated in an optically absorbent material, such as carbon loaded epoxy resin, to produce a high quality baffle on glass. This is illustrated in FIG. 4, in which a moth eye structure 40 formed on a substrate 41 is covered with an absorber layer 41 or absorbent material layer. The moth eye structure may be formed to the specific optical properties of the absorber layer.

Alternatively, the moth eye structure may be formed by grinding, or sandblasting the optical surfaces of the glass substrate wafer with a fine grit size to produce a fine scattering medium that may lend itself to over-molding with both the lens feature material and the opaque absorber material. The structure produced may have a pseudo-random nature, much as the printed moth eye structure, however, it may prove cheaper to manufacture and nearly as effective in reducing stray light when over-molded with the absorbent material.

Figure 5:
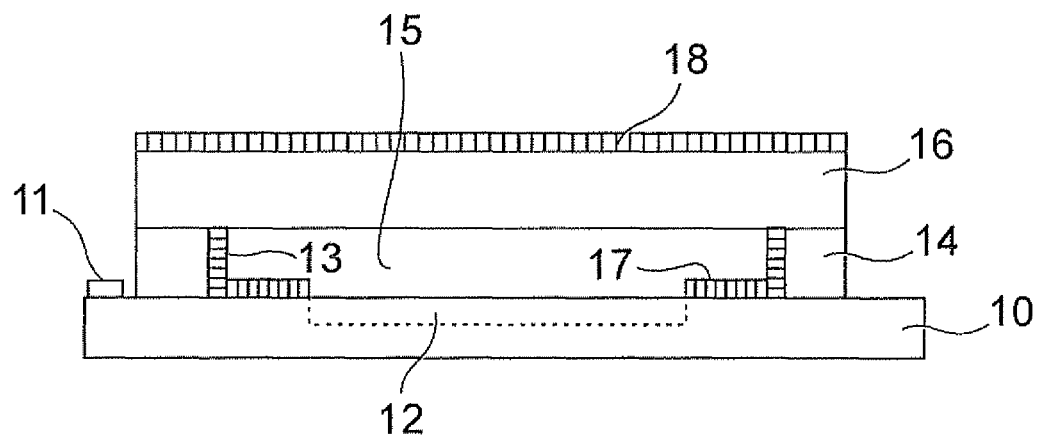
FIG. 5 illustrates an imaging assembly according to a second embodiment of the present invention.

One potential extension to this idea is the use of moth eye structures as anti-reflection surfaces on the optical elements (i.e. the lens) themselves. Moth eye structures may also be used in relation to air-cavity chip scale packages, as illustrated in FIG. 5. A silicon wafer 10 is provided onto which a CMOS sensor 12 is built by standard semiconductor processes. A spacer member 14, defining a wall structure, is attached to the wafer 10 to hold a fixed "air-cavity" 15 between the sensor surface and a package lid 16 attached to the top of the spacer member 14 over the CMOS sensor 12. The electrical contacts to the CMOS sensor are typically made by routing from custom connection pads on front of the silicon wafer to pads 11. The spacer member 14 and the package lid 16 are typically made from glass, and may be chosen to be expansion matched to the silicon wafer 10.

The stress problems generated during application of a thin film dielectric coating on the components of the chip scale package may currently preclude their use. Thus, with known chip scale package CMOS sensors, the lack of an anti-reflection mechanism may cause internal reflections within the glass or the air-cavity in the final product, which results in an interference pattern, which can be observed as rings in the final image. The mutual exclusion of anti-reflection coatings and reduced-stress manufacture may be addressed by using a moth eye structure.

The embodiments allow an anti-reflection structure (reducing the interference pattern formed by the Chip Scale Package (CSP)) to be formed internal to the air-cavity of the chip scale package without inducing the stresses in the glass, which make it unmanufactureable.

A moth eye structure 13 may be formed on the inner walls of the spacer member 14, 17, and the moth eye structure may be formed on the regions of the silicon wafer 10 surrounding the CMOS sensor 12 to further reduce internal reflections within the chip scale package. A moth eye structure 18 may also be formed on the outer surface of the package lid 16. Moth eye structures can reduce the reflectivity of a surface to 1%.

The application of moth eye structures in chip scale packages and wafer scale lenses brings advantages in that the glass components generally do not require the same degree of index matching as when standard thin-film coatings are used and therefore allow the designer to concentrate on the mechanical properties of the materials or coatings used. The application of moth eye structures to air-cavity chip scale packages allows the formation of other structures, such as those for improved alignment and to improve the strength of bonded sections at no extra cost.

The moth eye structure can be generated on the glass surface by the following techniques:
1. Direct etching onto glass using a mask tuned such as to produce the pseudo-random structure of the moth eye both in depth of etch and in the 2 dimensional pattern.
2. Direct laser ablation of the glass surface.
3. Transfer molding of the moth eye pattern using a UV set cement based transfer molding process.
4. Molding of a glass surface to form the moth eye structure using an embossing process directly onto the glass surface. Note that this may be followed by annealing to remove the residual stress in the surface.

The embodiments also allow for the inclusion of features on the silicon wafer 10 and/or the package lid 16 to aid in alignment, product tracking, and the formation of mechanical joints between the components and the spacer member 14. Alignment features can be built in the glass package lid 16 of the chip scale package at the same time as the moth eye structure is formed.

Figure 6:
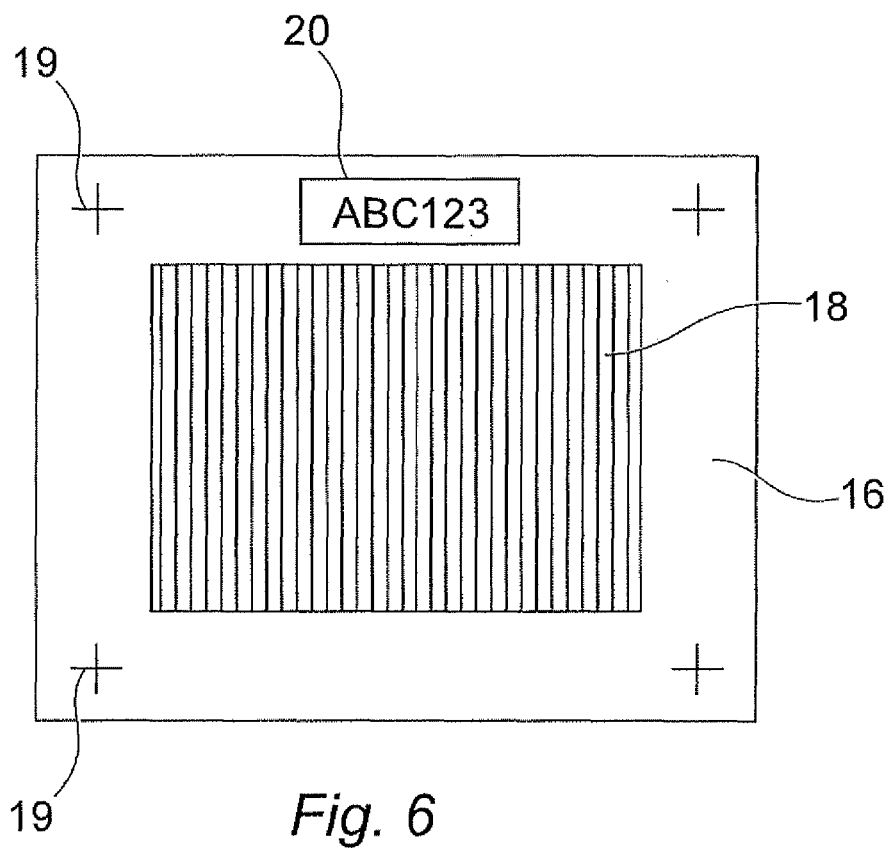
FIG. 6 is a plan view of a package lid used in an embodiment of the present invention.
Figure 7:
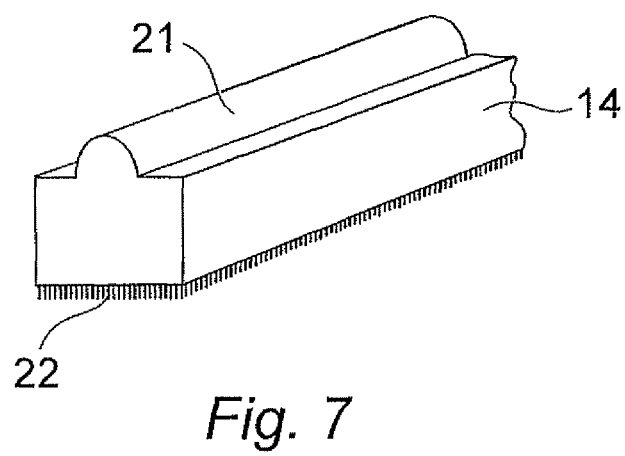
FIG. 7 is a perspective view of a spacer member used in an embodiment of the present invention.

Process control and tracking features can be included in the same manner as the alignment features. These could be markings that allowed either lot or tool tracking through the manufacturing process. For example, FIG. 6 illustrates a glass package lid 16 showing a moth eye structure 18, embossed markings 19 for use as alignment marks, and embossed or printed indicia 20 forming a lot number, or a tool number. Alignment can also be aided by mechanical features. For example, FIG. 7 illustrates a spacer member 14 formed with upper and lower lips 21 acting as locators for the lid 16 and silicon wafer 10.

Figure 8:
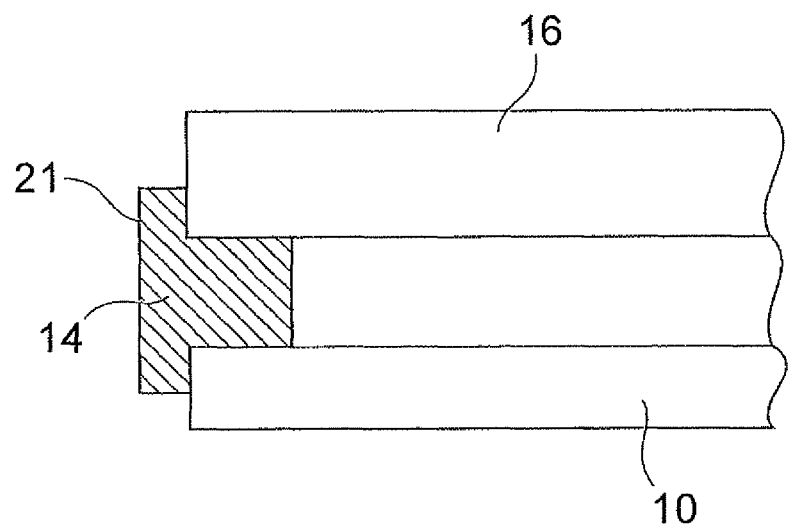
FIG. 8 is a side view illustrating another embodiment of the spacer member of FIG. 7.

Features aiding in the mechanical joint between the spacer member 14 and the silicon wafer 10 and/or the package lid 16 may be provided, such as raised sections to reduce stress at the junction between the spacer member 14 and the adjacent structure or a roughened zone to improve adhesion. FIG. 8 illustrates a spacer member 14 having a rounded bead section 21 for engagement with the package lid 16 and a roughened lower face 22 for adhering to the silicon wafer 10. Note that for the transfer molded implementation, there is the potential for the elasticity of the material used to compensate for any stress generated by the chip scale package structure.

The embodiments are applicable to a broad range of devices. An imaging assembly according to the present embodiments may be incorporated in a wide range of image sensors, which may be incorporated in such devices as a camera, particularly a digital camera, a mobile cellular telephone incorporating a digital camera, and an optical mouse. It will be appreciated that standard techniques may be employed by the man skilled in the art to implement the embodiments in these and other ways. Improvements and modifications may be incorporated without departing from the scope of the present embodiments.

That which is claimed is:

1. An imaging assembly comprising:
a substrate;
a first optical layer;
at least one spacer member; and
said at least one spacer member being arranged between the substrate and the first optical layer to define a gap between said substrate and said first optical layer;
an anti-reflection structure coupled to an internal portion of said at least one spacer member and an entire length of a surface of said first optical layer;
said anti-reflection structure comprising a plurality of projections having dimensions smaller than a wavelength of radiation to be imaged by the imaging assembly; and
a light-transmissive optical element coupled to said anti-reflection structure adjacent the first optical layer so that said anti-reflection structure is between said light-transmissive optical element and the surface of said first optical layer;
said anti-reflection structure, said first optical layer, and said light-transmissive optical element having matching refractive indices.

2. The imaging assembly according to claim 1, wherein said anti-reflection structure is also coupled to non-light transmissive regions of said substrate.

3. The imaging assembly according to claim 1, wherein said first optical layer comprises a first transparent optical layer.

4. The imaging assembly according to claim 1, wherein said anti-reflection structure comprises a plurality of projections having a height less than a wavelength of visible light.

5. The imaging assembly according to claim 4, wherein said anti-reflection structure comprises a plurality of projections having a height between 200 and 800 nm.

6. The imaging assembly according to claim 1, further comprising an optically absorbent material layer covering at least a portion of said anti-reflection structure.

7. The imaging assembly according to claim 6, wherein said optically absorbent material layer comprises a carbon loaded epoxy resin layer.

8. The imaging assembly according to claim 1, further comprising a solid state image sensor coupled to said substrate.

9. The imaging assembly according to claim 8, wherein said substrate comprises a silicon wafer having said solid state image sensor formed thereon; said at least one spacer member comprising a wall structure coupled to said substrate to encompass said solid state image sensor; said first optical layer comprising a cover coupled to said at least one spacer member to define a closed cavity over said solid state image sensor; at least one of at least part of the inner faces of said at least one spacer member and said first optical layer being exposed to the gap and being coupled to said anti-reflection structure.

10. The imaging assembly according to claim 9, wherein at least a portion of a surface of said first optical layer facing said solid state image sensor is coupled to said anti-reflection structure.

11. The image assembly according to claim 9, wherein at least a part of an outer surface of said first optical layer is coupled to said anti-reflection structure.

12. The image assembly according to claim 9, wherein regions of said silicon wafer around said solid state image sensor are coupled to said anti-reflection structure.

13. The image assembly according to claim 9, wherein at least one of said silicon wafer and said first optical layer comprises a plurality of surface features configured to aid alignment of said at least one spacer member upon at least one of said silicon wafer and said first optical layer to improve adhesion of said at least one spacer member thereto.

14. The image assembly according to claim 13, wherein said plurality of surface features comprises a roughened surface region to improve adhesion of said at least one spacer member to at least one of said substrate and said first optical layer.

15. The image assembly according to claim 13, wherein said plurality of surface features comprises raised formations configured to aid location of said at least one spacer member on said substrate and configured to reduce stresses at a junction of said at least one spacer member and at least one of said substrate and said first optical layer.

16. The imaging assembly according to claim 1, wherein said first optical layer comprises an at least partially transparent member having an upper surface and a lower surface; and wherein said light-transmissive optical element comprises a lens coupled to at least one of said upper and lower surfaces; said at least one spacer member having inner faces facing the gap and coupled to said anti-reflection structure.

17. The imaging assembly according to claim 16, further comprising a further spacer member coupled to said upper surface of said first optical layer and a further optical layer coupled to said further spacer member above said first optical layer; said further optical layer comprising an upper surface and a lower surface; said imaging assembly further comprising a further lens coupled to at least one of said upper and lower surfaces of said further optical layer; said further spacer member comprising inner faces facing a further gap between said first and further optical layers and coupled to said anti-reflection structure.

18. The imaging assembly according to claim 16, further comprising a plurality of further spacer members and a plurality of further optical layers arranged in a coaxial stacked relationship upon said first optical layer each of said plurality of further spacer members coupled to said anti-reflection structure on inner faces thereof.

19. A method of manufacturing an imaging assembly comprising a substrate, an optical layer, and at least one spacer member, wherein the at least one spacer member is coupled between the substrate and the optical layer to define a gap therebetween, the method comprising:
    forming an anti-reflection structure on an internal portion of the at least one spacer member and an entire length of a surface of the optical layer; the anti-reflection structure comprising a plurality of projections having dimensions smaller than a wavelength of radiation to be imaged by the imaging assembly; and
    forming a light-transmissive optical element on the anti-reflection structure adjacent the optical layer so that the anti-reflection structure is between the light-transmissive optical element and the surface of the first optical layer;
    the anti-reflection structure, the optical layer, and the light-transmissive optical element having matching refractive indices.

20. The method according to claim 19 wherein the optical layer comprises a transparent optical layer.

21. The method according to claim 19, wherein forming the anti-reflection structure comprises forming the anti-reflection structure by at least one of lithographic etching, laser ablation, transfer molding, embossing processes, fine sand blasting of the surfaces with a fine grit, and grinding of the surfaces with a fine grit.

22. The method according to claim 19, wherein forming the light-transmissive optical element comprises forming a lens on at least one of an upper and lower surface of the optical layer; and wherein forming the anti-reflection structure comprises forming the anti-reflection structure in a same step as forming the lens.

23. The method according to claim 19, wherein forming the light-transmissive optical element comprises over-molding the light-transmissive optical element on at least a portion of the anti-reflection structure on at least one of an upper and a lower surface of the optical layer.

24. The method according to claim 19 wherein the imaging assembly further comprises an image sensor coupled to the substrate; the method further comprising forming the anti-reflection structure on a region of the substrate around the image sensor.

25. The method according to claim 19, further comprising coating at least a portion of the anti-reflection structure with an optically absorbent material.

26. The method according to claim 25, wherein the coating comprises a carbon loaded epoxy resin.

27. An electronic device comprising:
    an imaging assembly comprising
        a substrate,
        a first optical layer,
        at least one spacer member, and
        said at least one spacer member being arranged between said substrate and said first optical layer to define a gap between said substrate and said first optical layer,
        an anti-reflection structure coupled to an internal portion of said at least one spacer member and an entire length of a surface of said first optical layer,
        said anti-reflection structure comprising a plurality of projections having dimensions smaller than a wavelength of radiation to be imaged by the imaging assembly, and
        a light-transmissive optical element coupled to said anti-reflection structure adjacent first optical layer so that said anti-reflection structure is between said light-transmissive optical element and the surface of said first optical layer, said anti-reflection structure, said first optical layer, and said light-transmissive optical element having matching refractive indices.

28. The electronic device according to claim 27, wherein the electronic device comprises a mobile device.

29. The electronic device according to claim 28, wherein said mobile device comprises a mobile cellular telephone.

30. The electronic device according to claim 28, wherein the electronic device comprises a camera.

31. The electronic device according to claim 27, wherein the electronic device comprises a medical device.

32. The electronic device according to claim 27, wherein the electronic device comprises an optical pointing device.

* * * * *